US010298207B2

(12) United States Patent
Freisleben

(10) Patent No.: US 10,298,207 B2
(45) Date of Patent: May 21, 2019

(54) FILTER WITH IMPROVED LINEARITY

(71) Applicant: SnapTrack, Inc., San Diego, CA (US)

(72) Inventor: Stefan Freisleben, Neubiberg (DE)

(73) Assignee: SnapTrack, Inc., San Diego, CA (US)

( * ) Notice: Subject to any disclaimer, the term of this patent is extended or adjusted under 35 U.S.C. 154(b) by 79 days.

(21) Appl. No.: 15/315,370

(22) PCT Filed: Aug. 5, 2015

(86) PCT No.: PCT/EP2015/068064
§ 371 (c)(1),
(2) Date: Nov. 30, 2016

(87) PCT Pub. No.: WO2016/034357
PCT Pub. Date: Mar. 10, 2016

(65) Prior Publication Data
US 2017/0201235 A1   Jul. 13, 2017

(30) Foreign Application Priority Data
Sep. 3, 2014   (DE) ........................ 10 2014 112 676

(51) Int. Cl.
  *H03H 9/64*   (2006.01)
  *H03H 9/54*   (2006.01)
  *H03H 9/56*   (2006.01)
  *H03H 9/60*   (2006.01)
  *H03H 9/02*   (2006.01)

(52) U.S. Cl.
  CPC ...... *H03H 9/6483* (2013.01); *H03H 9/02228* (2013.01); *H03H 9/02535* (2013.01); *H03H 9/542* (2013.01); *H03H 9/568* (2013.01); *H03H 9/605* (2013.01)

(58) Field of Classification Search
  CPC ........... H03H 9/02228; H03H 9/02535; H03H 9/542; H03H 9/568; H03H 9/605; H03H 9/6483
  USPC .................. 333/133, 187, 188, 193–196
  See application file for complete search history.

(56) References Cited

U.S. PATENT DOCUMENTS

| 6,741,145 B2 * | 5/2004 | Tikka .................. H03H 9/0095 333/133 |
| 7,170,370 B2 | 1/2007 | Inoue et al. |
| 8,125,298 B2 * | 2/2012 | Hara .................... H03H 9/0571 333/133 |
| 8,310,321 B2 | 11/2012 | Kadota |

(Continued)

FOREIGN PATENT DOCUMENTS

| EP | 1209807 A2 | 5/2002 |
| EP | 1544997 A2 | 6/2005 |

(Continued)

OTHER PUBLICATIONS

International Search Report and Written Opinion—PCT/EP2015/068064—ISA/EPO—dated Jan. 12, 2016.

*Primary Examiner* — Robert J Pascal
*Assistant Examiner* — Jorge L Salazar, Jr.
(74) *Attorney, Agent, or Firm* — Patterson & Sheridan, L.L.P.

(57) ABSTRACT

For a reactance filter constructed from serial and parallel resonators, in order to improve the linearity, it is proposed to connect a capacitor in series or in parallel either with a parallel resonator or a cascade of parallel resonators or with a series resonator or a cascade of series resonators.

14 Claims, 6 Drawing Sheets

(56) References Cited

U.S. PATENT DOCUMENTS

| | | | |
|---|---|---|---|
| 8,701,065 B1 | 4/2014 | Silver et al. | |
| 2002/0140519 A1 | 10/2002 | Takayama et al. | |
| 2005/0212612 A1* | 9/2005 | Kawakubo | H03H 9/542 331/117 R |
| 2011/0316649 A1* | 12/2011 | Link | H03H 9/566 333/133 |
| 2013/0200960 A1* | 8/2013 | Sauer | H03H 3/10 333/133 |

FOREIGN PATENT DOCUMENTS

| | | |
|---|---|---|
| EP | 2141805 A2 | 1/2010 |
| WO | WO-2010100148 A1 | 9/2010 |

* cited by examiner

PRIOR ART

FILTER WITH IMPROVED LINEARITY

INTRODUCTION

In telecommunications and electroacoustics, intermodulation (IM or IMD) denotes the production of undesired spectral components as a result of nonlinear transfer functions of circuit parts if at least two different frequencies have to be processed. Since such intermodulation products can lead to undesired signals and thus to interference in a frequency range used, endeavors are always made to avoid the production of interfering intermodulation products.

Furthermore, during the generation of RF signals, harmonics can always form, too, the frequencies of which are a not necessarily even-numbered multiple of the fundamental mode. Although such harmonics are far enough away from the fundamental mode they can interfere in other bands. Generally, harmonics can also be regarded as intermodulation products of two frequencies f1 and f2 for the special case f1=f2.

Intermodulation products/harmonics of second, third and even higher order exist which differ in the factors, or the sum thereof, with which the fundamental frequencies influence the mixed products.

In order to avoid intermodulation products and interfering harmonics, attempts are made firstly to increase the linearity of components and circuit parts. Where this does not succeed, attempts can be made to reduce the voltage across the nonlinear component in order to increase the range in which the circuit element operates linearly.

In the field of filter technology, and therein in particular in the case of reactance filters constructed from a network of serial and parallel resonators, intermodulation products can be suppressed, but never completely avoided, by the cascading of a plurality of resonators. One disadvantage of the cascading is that the static capacitance required for the filter, in the case of an interconnection of resonators, that is to say a cascade of resonators, can be maintained and set only by increasing the basic areas of the individual capacitors or resonators. This has the effect that the area requirement of resonator filters becomes too large as cascading increases, and the cascading thus becomes uneconomic. Moreover, this is at odds with the requirement for miniaturization.

A further disadvantage is that a saturation effect occurs as cascading increases, such that despite the addition of further resonators to the cascade, the effect achieved becomes less and less or the additionally achievable suppression of intermodulation products and also of harmonics becomes smaller and smaller with each further resonator.

FIG. 9 illustrates how the suppression of second order (IMD2) and third order (IMD3) intermodulation products behaves as a function of the degree n of cascading, where n is the number of resonators interconnected in series. The saturation is revealed well by the curves increasingly flattening as they fall. This shows that cascading is technically and economically expedient only up to a certain degree.

BRIEF SUMMARY

It is an object of the present invention to specify a filter circuit having an improved linearity and hence an improved suppression of intermodulation products and harmonics. Moreover, the improved filter circuit is intended to be able to be realized with a moderate increase in the resonator areas.

This object is achieved according to the invention by means of a filter circuit having cascaded resonator arrangements further described herein.

The filter circuit comprises a first filter configured as a reactance filter. Such a filter comprises a serial signal path (series branch) coupled between a first filter port and a second filter port. In each case a parallel branch branches off from circuit nodes arranged in the serial signal path, said parallel branch connecting the circuit nodes to a fixed potential. At least one resonator or an interconnection of resonators is arranged in the series branch and each of the parallel branches.

The reactance filter can begin at a circuit port with a circuit node or with a resonator in the series branch.

At least in the first parallel branch, which is arranged closest to one of the filter ports, or in the series branch directly adjacent to a filter port, a plurality of resonators are interconnected in series, wherein a first capacitor is interconnected in series or in parallel with the series interconnection of a plurality of resonators, the first case resulting in voltage division and the second case resulting in current division.

A basic concept of the invention, therefore, is that of providing a voltage divider or current divider circuit comprising at least one linear element. The capacitor mentioned is a preferred linear element, but other linear elements suitable for dividing the voltage are also possible. In this way it is possible to reduce the saturation effect described in the introduction, which otherwise has the consequence that as the degree of cascading increases, that is to say as the number of series-interconnected resonators increases, the effect observed in avoiding intermodulation products becomes less and less. The capacitor furthermore has the advantage that the voltage or current divider effect achieved therewith is relatively broadband in terms of operation and is thus usable over a wide frequency range. The following holds true in the case of voltage division: the greater the voltage drops across the linear element, the greater the effect, that is to say the reduction of intermodulation products. The smaller the capacitance of the capacitor in comparison with the total capacitance in the series or parallel branch, the greater the effect and the greater the extent to which the occurrence of intermodulation products and harmonics is prevented.

A capacitor which is connected in parallel with the interconnection of resonators, that is to say with the cascade of serially interconnected resonators, serves as a current divider. Here, too, it holds true that the more current flows via a linear element and thus the less current flows via nonlinear elements, the lesser the extent to which intermodulation products/harmonics occur according to the invention.

The linear element acts, in principle, independently of where it is used in the filter circuit. However, it has the greatest effect in series or in parallel with those resonators which are closest to that filter port at which at least one signal which can form intermodulation products and harmonics with itself or with another system frequency at nonlinear elements acts or couples into the signal path. Said filter port can be the filter input or the filter output since the coupling-in is dependent on the entire circuit environment and therefore customer-specific and independent of the filter circuit as such. According to the invention, therefore, the linear element is in any case interconnected with this "first" resonator. The "first" resonator can be a serial resonator or else, if the first node and thus the "first" parallel arm is closer to the filter port, a parallel resonator.

A linear capacitor can be realized in a simple manner as a plate capacitor together with the resonators on a common substrate. However, it is also possible to interconnect the capacitor as an external discrete element with the resonators. In this case, however, integration on the common substrate affords the greater advantages. In comparison with an inductance which can likewise be interconnected with the resonators as a feedback element, the capacitor has the advantage that no additional resonances and thus no additional interference in the transmission behavior of the filter can occur with said capacitor and that the voltage or current divider effect can be realized as a more broadband effect with the capacitor.

A disadvantage of the filter circuit proposed is that the pole zero distance of the resonators decreases as a result of the voltage or current division, which directly affects the bandwidth of the filter. Although the desired bandwidth can be set by optimizing the filter, it is necessary here to accept the disadvantage that the filter behavior can deteriorate slightly both in the passband, in particular the VSWR, and in the near stop band.

A filter circuit comprising a first filter optimized according to the invention therefore constitutes a trade-off between a good transmission behavior/VSWR and a reduction of intermodulation products/harmonics. It is thus necessary to weigh up whether in preference the intention is to avoid interfering intermodulation products/harmonics or whether more value is placed on an optimized transmission behavior/VSWR.

A positive effect according to the invention is already achieved, however, if, in the first series or parallel branch, an individual resonator is connected in series or in parallel with a capacitor. The static capacitance of the resonator and the capacitance of the capacitor together produce the total capacitance of the series or parallel branch. Both together must be taken into consideration in the filter design.

In one preferred embodiment, the resonators are designed as resonators operating with acoustic waves. Therefore, SAW-, FBAR- or BAW-based (Surface Acoustic Wave, Thin Film Bulk Acoustic Wave or Bulk Acoustic Wave) resonators are suitable for the filter circuit or the first filter of the filter circuit. GBAW (Guided Bulk Acoustic Wave) resonators are also suitable. In all cases the capacitance of the resonators can be set by way of the resonator area. In this case, the resonator area of a BAW resonator results as the overlap area between first and second plate-shaped electrodes, in particular insofar as a piezoelectric material is arranged in between. In the case of SAW resonators, the capacitance is dependent on the product of the aperture of the resonators and the member of electrode fingers in the resonator.

In principle, however, the resonators can also be embodied as LC resonators, wherein a reduction of intermodulation products/harmonics can likewise be achieved by interconnection with a capacitor in the parallel branch or in parallel with the parallel branch.

In one possible configuration, the interconnection of resonators in the first parallel branch comprises a series interconnection of four to eight resonators. With this number, a good transmission behavior in conjunction with sufficient damping of intermodulation products/harmonics is achieved in conjunction with a tenable area requirement. Other embodiments can also comprise a higher or lower number of resonators in the interconnection.

In a further configuration, a second capacitor is interconnected in series or in parallel with a further serial or parallel resonator. Said second capacitor is optional and leads to a further reduction of the voltage drop across the individual nonlinear elements, whereas the capacitor itself constitutes a largely linear element. In this way, too, intermodulation products/harmonics are reduced further.

The second capacitor, too, is arranged as close as possible to that filter port via which one of the signal leading to interference or intermodulation products is coupled in.

If the corresponding resonator is a series resonator, then "connection in parallel" with said series resonator means that the second capacitor is arranged in a parallel series path which is connected to a circuit node of the side branch upstream and downstream of the serial resonator.

If the corresponding resonator is a parallel resonator, then the second capacitor is preferably arranged in a parallel branch which is directly adjacent to the parallel branch with the resonator and therefore, is linked in particular to the same circuit node in the serial signal path as the parallel branch with the resonator.

In one advantageous configuration, the first filter is a reception filter of a filter circuit comprising a plurality of transmission branches coupled to the filter input or the filter output. Since the transmission branches are designed for transmission in different frequency bands, intermodulation products can occur, in principle, in such a filter circuit and can occur within the passband of the reception filter in the case of an unfavorable configuration. The coupling of different frequencies or the coupling of frequencies outside the useful signal into a filter can take place capacitively, inductively, resistively or electromagnetically and cannot be completely avoided. By contrast, the further consequence of the coupling-in, the occurrence of intermodulation products/harmonics owing to nonlinear elements, can be reduced by the invention.

In a further configuration, the first filter is designed as a reception filter. It can be part of a filter circuit comprising further transmission and/or reception branches.

The first filter can also be part of a duplexer or of a multiplexer which is part of a filter circuit having a plurality of transmission branches whose signals can potentially couple into the signal path of the filter.

In a further configuration of the invention, the first filter comprises further capacitors, which can be provided upstream of the first resonator, downstream of the last resonator and additionally between individual resonators or between always respectively two resonators arranged in the signal path or between all interconnections of resonators arranged in the signal path. Further capacitors can be connected in parallel with resonators or cascaded interconnections of resonators.

The first filter can exclusively comprise resonators as filter elements. However, it is also possible to interconnect a DMS filter in series in the signal path. This is realized in a simple manner by a circuit node within the serial signal path being connected to the input of the DMS filter and a further circuit node being connected to the output of the DMS filter. However, the DMS filter is preferably not directly adjacent to the filter input, but rather arranged between two resonators or between two interconnections of resonators in the serial signal path.

As already mentioned, an embodiment having capacitors integrated on the filter substrate is distinguished particularly advantageously. In this case, the resonators are configured as resonators operating with acoustic waves and are arranged on a common chip. The first capacitor and/or the second capacitor and/or the further first and second capacitors are/is realized as plate capacitors on the same chip. Each plate capacitor of this type comprises two capacitor electrodes shaped in a planar fashion and a dielectric layer arranged therebetween. Shaped in a planar fashion means here that the cross section is considerably increased relative to that of a conductor track.

For better integrability, it is advantageous if the dielectric layer is produced together with a further functional layer of the chip component in a common production step. In this way, it is possible to use a method step which is already required in the production of known filters in order to deposit or to produce the capacitor according to the invention or the dielectric of the capacitor.

In general, the common production of the functional layer and the dielectric layer means that both comprise the same material and have the same layer thickness. However, it is also possible subsequently to thicken the functional layer or the dielectric layer in an additional method step or to reduce it again in terms of layer thickness. In all cases it is important to produce a capacitor which has the highest possible linearity and which is distinguished, in particular, by a high layer thickness control.

One embodiment comprises as dielectric an organic polymer that is used elsewhere in the first filter or in the filter circuit for insulating conductor tracks in the crossover region of two conductor tracks. A proven and advantageously usable material here is polymers based on BCB (benzocyclobutane) and the derivatives thereof. This proven material for semiconductor circuits has a low dielectric constant and can be produced with high layer thickness uniformity in a simple manner in standard processes.

In a further embodiment, the dielectric layer used is a material which is used in known filters for the compensation of an excessively high temperature response of the center frequency, that is to say of an excessively high temperature coefficient of the center frequency. A layer of a material having a positive temperature coefficient of the mechanical properties is usually used for this purpose, in particular $SiO_2$. According to the invention, therefore, this $SiO_2$ layer can be used as a dielectric layer for the capacitor, wherein its layer thickness can be optimized either to provide an optimum capacitance value of the capacitor or to achieve an optimum compensation of the temperature coefficient or a trade-off with respect thereto.

Generally, other materials having a positive temperature coefficient of the mechanical properties can also be used for this purpose. After producing the dielectric layer, it is necessary subsequently to also apply the top capacitor electrode above the dielectric layer.

In a further embodiment, for the electrodes of the plate capacitor, too, use is advantageously made of a material and/or a method step already used elsewhere in the filter and/or in the method.

In this regard, e.g. the bottom electrode of the capacitor can be formed from the metallization of an one-port SAW resonator used as resonator. The top electrode of the capacitor can be configured e.g. together with a pad thickening produced above the connection pads of the filter.

It is possible for the linearizing capacitor to comprise customary electrode structures of an electroacoustic resonator. The capacitor can then be detuned in terms of its resonant frequency. It is also possible for e.g. a quasi-SAW resonator or a quasi-GBAW resonator to be rotated relative to the crystal axes of the substrate such that its electroacoustic coupling coefficient $\kappa^2$ is sufficiently small.

In a filter circuit according to the invention, the greatest effect is exhibited by those capacitors which are arranged closest to the filter port via which at least one of the signals leading to intermodulation products or harmonics is coupled in. The same applies to the cascading of resonators, which is likewise preferably performed in particular in the case of those resonators which are directly or closely adjacent to the filter input or some other filter port.

One advantageous filter circuit therefore comprises resonators and interconnections of a plurality of resonators, wherein, in one embodiment, the interconnection of a plurality of resonators comprises cascaded resonators and the degree of cascading of the resonators and of the filter circuit decreases with increasing distance from the filter input. In this way, it is possible to limit the area requirement of the filter circuit, which is increased in parallel as the cascading increases.

A filter according to the invention can comprise an optimized number of parallel branches. Advantageously, 2-7, in particular 2-4, parallel branches are provided in the filter.

A filter according to the invention can comprise an optimized number of series elements. A series element is a series resonator, an interconnection of series resonators or some other element such as e.g. a DMS filter or a DMS substructure. A second capacitor can also be part of a series element. A series element is delimited by circuit nodes on both sides. A respective series element can be arranged between the filter input and the first circuit node or between the filter output and the filter output. Advantageously 2-6 series elements are provided.

It is not necessary to add a linearizing element to each resonator or series branch or parallel branch. It essentially suffices to interconnect the element, e.g. a linearly operating capacitor, where the effect is greatest. Depending on whether or not the original signal and/or the interference signal are/is in a passband, the ideal position of the element within the circuit topology can vary.

The invention is explained in greater detail below on the basis of exemplary embodiments and the associated figures. Insofar as the figures illustrate filters and filter circuits, these are embodied only schematically. This also means that each of the filter circuits illustrated can comprise further elements which are not absolutely necessary, but which can be used for further optimization of the filter in a manner known per se for filter circuits. Elements which are unimportant for the invention can also be omitted.

DETAILED DESCRIPTION

Figure 1A:
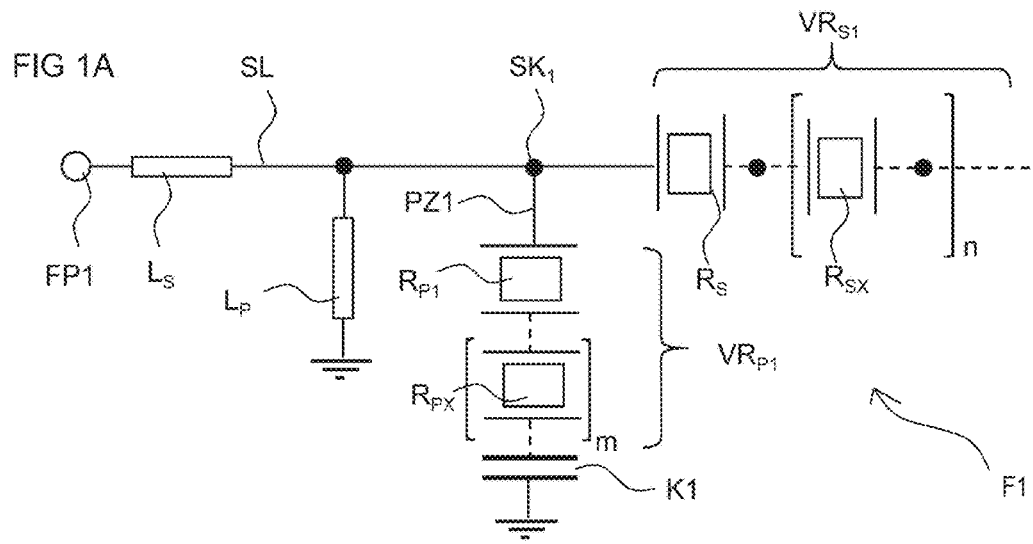
FIGS. 1A and 1B show simple embodiments with a respective capacitor arranged in a parallel branch.

FIG. 1A shows a simple exemplary embodiment of the invention. The illustration schematically shows a filter of a filter circuit in which a serial signal line SL connects a first filter port Fp1 to a second filter port Fp2, which can optionally be assigned to filter input and output. A serial resonator RS1 is arranged in the signal line SL. Optionally, in the signal line SL, n further resonators RSX can also be interconnected with the first serial resonator RS1. N can assume integer values of from zero to approximately 10. The serial resonators connected in series one directly after another form a first interconnection of resonators VRS1. All the resonators RSX can have different characteristic variables such as resonant frequency or static capacitance.

Circuit nodes SK to which further elements, filter branches or signal lines are coupled can be provided upstream or downstream of the serial resonators. In FIG. 1A, a first parallel branch PZ1 branches off from a first circuit node SK1, said first parallel branch connecting the first circuit node SK1 to a fixed potential, here to ground potential. A first parallel resonator RP1 is arranged in the first parallel branch PZ1, said first parallel resonator optionally being connected in series with a number m of further parallel resonators RPX connected in series. The value m can be chosen independently of n and assumes similar values. The parallel resonators together produce an interconnection VRP1. A first capacitor K1 is connected in series between the interconnection of parallel resonators and the fixed potential. Said resonators RPX, too, among one another and in relation to RSX, can have different characteristic variables such as resonant frequency or static capacitance.

Optionally, further passive components can be incorporated or linked in the signal line SL. It is possible, for example, to incorporate a series inductance LS between the filter port FP1 and the first circuit node SK1. Alternatively, from a circuit node between the first filter port FP1 and the first serial resonator RS1, a parallel coil LP can be connected relative to ground.

A further series coil LS and/or a further parallel coil LP can be correspondingly provided on the side of the second filter port FP2.

The indices n and m determine the degree of cascading of the interconnection and can therefore assume integer values of from 1 to approximately 10. In principle, higher values are also possible for the indices n and m, but such a high degree of cascading is economically and technically inexpedient owing to the requisite area for the filter circuit. n and m can be chosen differently from one another. Not illustrated in FIG. 1A are further parallel branches that can be connected from further circuit nodes in the signal line SL relative to ground. Further interconnections of series resonators can additionally be provided between two such circuit nodes SK.

With a filter circuit in accordance with FIG. 1A, in comparison with a filter circuit without the first capacitor K1, a reduction of a specific intermodulation product by 10 dB is achieved or an improvement by 10 dB can be achieved. This figure and the following figures omit the illustration of further elements which can be present in the filter circuit, in particular further parallel branches, further serial resonators or further interconnections of serial resonators. Series and/or parallel inductances can also be provided in the signal line or be coupled to the signal line.

Figure 1B:
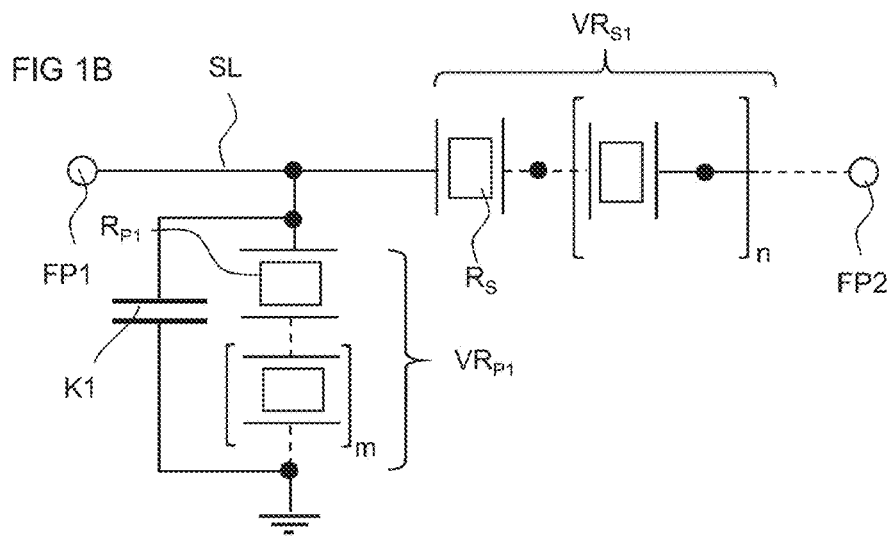

FIG. 1B shows a further exemplary embodiment, wherein, in contrast to FIG. 1A, within the first parallel branch PZ1, a first capacitor K1 is not connected in series with the interconnection of parallel resonators VRP1, but rather in parallel with said interconnection. Consequently, this first capacitor K1 connected in parallel connects the circuit node in the signal line to the fixed potential. In this embodiment, too, intermodulation products are damped by up to 10 dB.

Figure 1C:
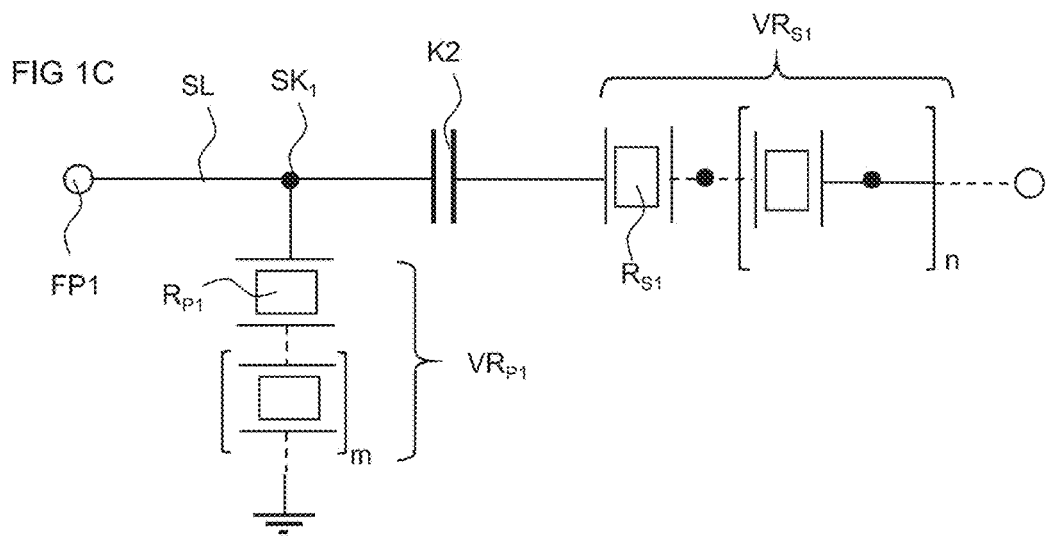
FIGS. 1C and 1D show simple embodiments with a respective capacitor arranged in a series branch.

FIG. 1C shows a further embodiment of the invention, which is configured similarly to FIG. 1A, but in which a second capacitor K2 is interconnected in the series branch SL, here between the first circuit node SK1, from which the first parallel branch PZ1 branches off, and the first interconnection of serial resonators VRS1. It is also the case with this second capacitor K2 alone, which serves as a voltage divider in the signal line, that the linearity of the filter circuit is increased in comparison with known filter circuits having the same number of resonators RS, RP but without a capacitor.

Otherwise, the same possibilities as were explained with reference to FIGS. 1A and 1B hold true for possible extensions of this structure.

Figure 1D:
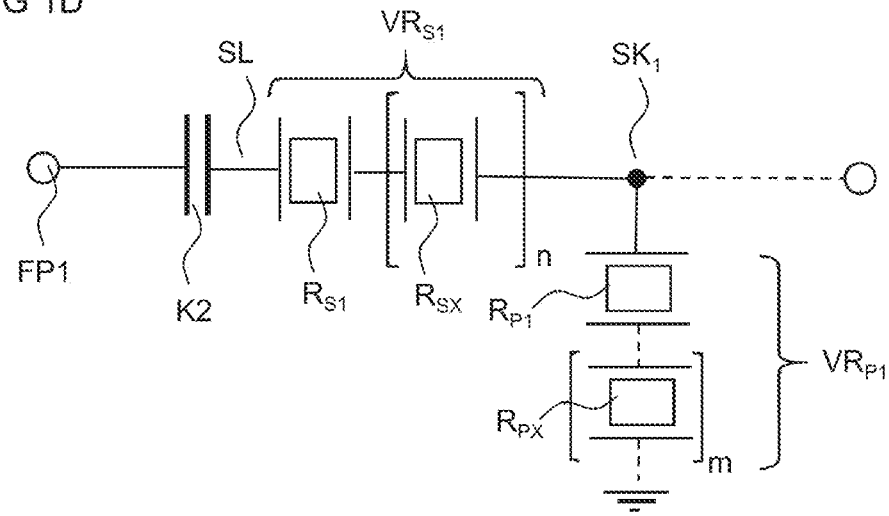

FIG. 1D shows an embodiment similar to FIG. 1C, wherein the first circuit node SK1 is arranged in the signal line SL downstream of the first resonator RS1 or the first interconnection of serial resonators VRS1 and the second capacitor K2 is provided between the first resonator RS1 or the first interconnection VRS and the first filter port FP1. Further interconnections VRS of serial resonators can be provided between first circuit node SK1 and second filter port FP2. Likewise, further circuit nodes SK to which further parallel branches PZ are linked can be provided. Moreover, a further serial second capacitor K2 can be provided between two respective circuit nodes. Moreover, in each parallel branch a further first capacitor K1 can be provided between the fixed potential and an interconnection of parallel resonators.

Figure 1E:
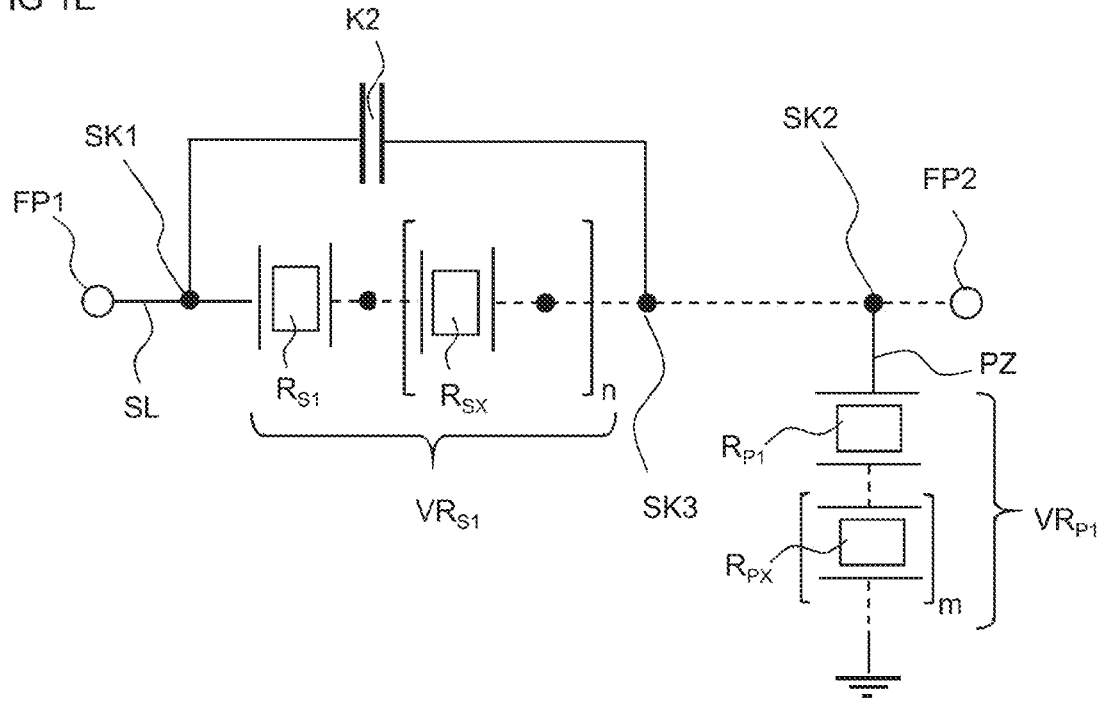
FIG. 1E shows an embodiment with a capacitor arranged in a parallel series branch.

FIG. 1E shows a filter circuit similar to FIG. 1D. Here a second capacitor K2 is arranged in parallel with the first interconnection VRS of serial resonators VRS. A first parallel branch PZ, linked to a first circuit node SK1, has an interconnection VRP1 of parallel resonators. At least one further interconnection of serial resonators VRS can be provided between the first interconnection of serial resonators VRS1 and the second filter port FP2. A respective parallel branch can be linked to circuit nodes SK on both sides of the interconnection of serial resonators VRS.

In this embodiment, too, in which the second capacitor K2 provides for a current division in the serial signal line, the linearity of the filter circuit is increased and the occurrence of intermodulation products/harmonics is reduced as a result.

Figure 2:
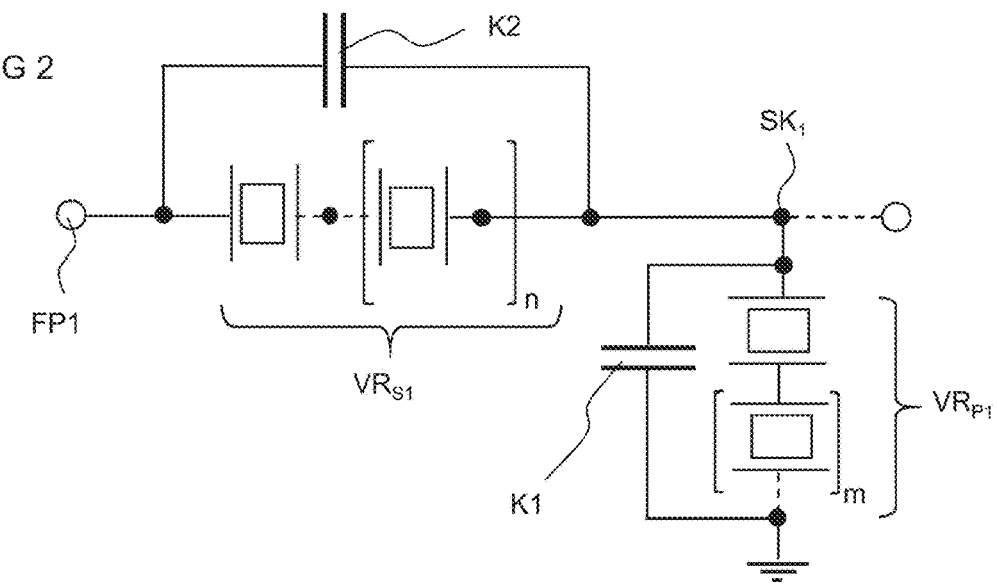
FIGS. 2 to 5 show embodiments with in each case two capacitors arranged in a parallel branch and additionally in the signal path, wherein the capacitors are both interconnected in series or in parallel with resonators, or wherein the two capacitors are interconnected differently in the series branch and in the parallel branch.

FIG. 2 shows a filter circuit in which a first capacitor K1 is connected in parallel with an interconnection of parallel resonators VRP and in which a second capacitor K2 is connected in parallel with an interconnection of serial resonators VRS. Both the interconnection of serial resonators in the signal line VRS1 and the interconnection of parallel resonators SRP in the first parallel branch PZ1 are bridged with a respective capacitor K1, K2.

Figure 3:
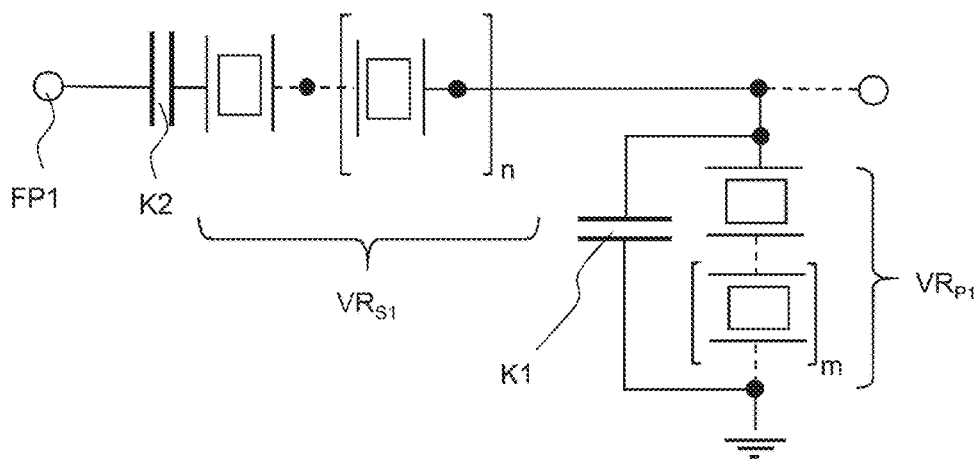

FIG. 3 shows an embodiment in which a second capacitor K2 provided in the signal line SL and a first capacitor K1 connected in parallel with the first parallel branch PZ1 are interconnected. The filter circuit can comprise further serial resonators or further interconnections of serial resonators and also further parallel branches in which further resonators or further interconnections of parallel resonators are arranged.

Figure 4:
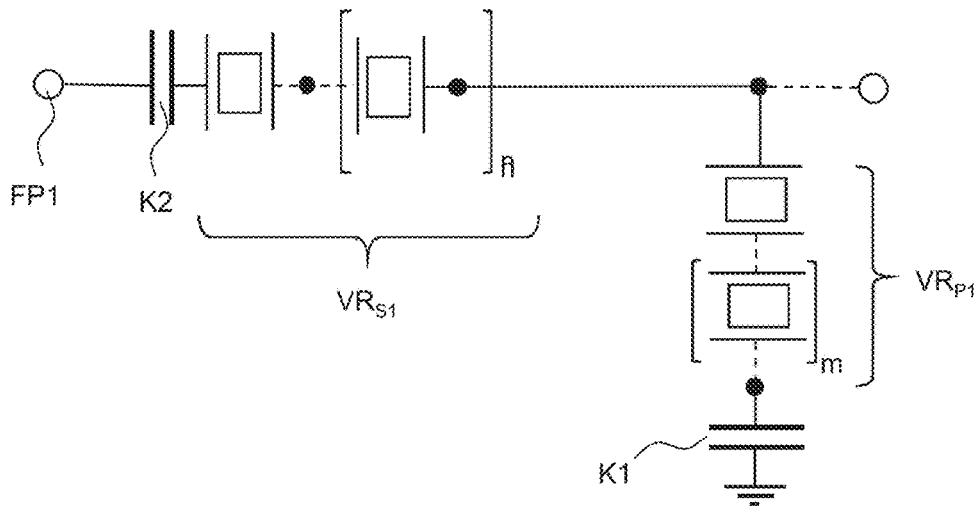

FIG. 4 shows a filter circuit similar to FIG. 3, but in which the first capacitor K1 is arranged in parallel with a parallel resonator RP or with an interconnection of parallel resonators VRP.

Figure 5:
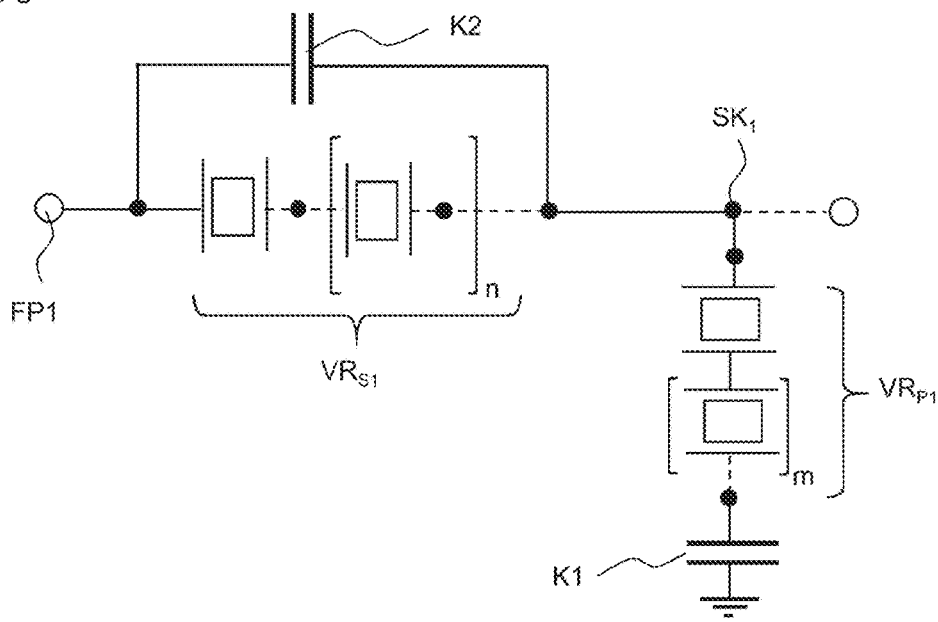

FIG. 5 shows a filter circuit similar to FIG. 4, but in which the first capacitor K1 is arranged in series with a parallel resonator RP or with an interconnection of parallel resonators VRP.

In embodiments that are not illustrated, the filter circuit begins with a parallel branch, while FIGS. 1D to 6 all begin with a series resonator or an interconnection of series resonators. In this case, "begin with" relates to the resonator situated closest to the filter port serving as input.

Figure 6:
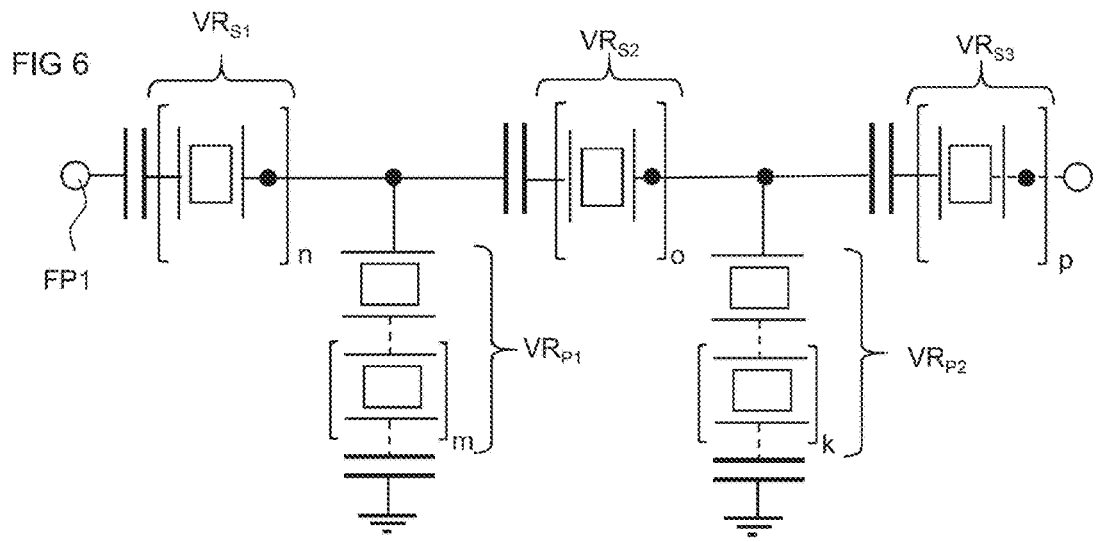
FIG. 6 shows a filter circuit comprising more than one first and more than one second capacitor in the parallel path and in the signal path.

FIG. 6 shows a filter circuit in which three interconnections of serial resonators VRS are arranged in the signal line SL. A circuit node SK is provided between respectively two of such interconnections, from which circuit node a parallel branch PZ with an interconnection of parallel resonators VRP arranged therein is respectively provided.

A respective second capacitor K2 is provided between filter input and first interconnection of serial resonators and also between first and second interconnections of serial resonators and also between second and third interconnections of serial resonators.

From circuit nodes between respectively two serial interconnections of resonators VRS, in each case a parallel branch PZ with an interconnection of parallel resonators VRP provided therein branches relative to ground.

The indices n, o, p denoting the degree of cascading of the interconnection of serial resonators VRS are chosen individually and can assume values of between 1 and 10. The indices m, k indicating the degree of cascading of the interconnections of parallel resonators VRP can likewise assume values of between 1 and 10. Preferably, the degree of cascading of serial and also of parallel interconnections is chosen in the lower range of the interval, such that the corresponding indices preferably have values of between 1 and 7, better between 1 and 5.

Figure 7:
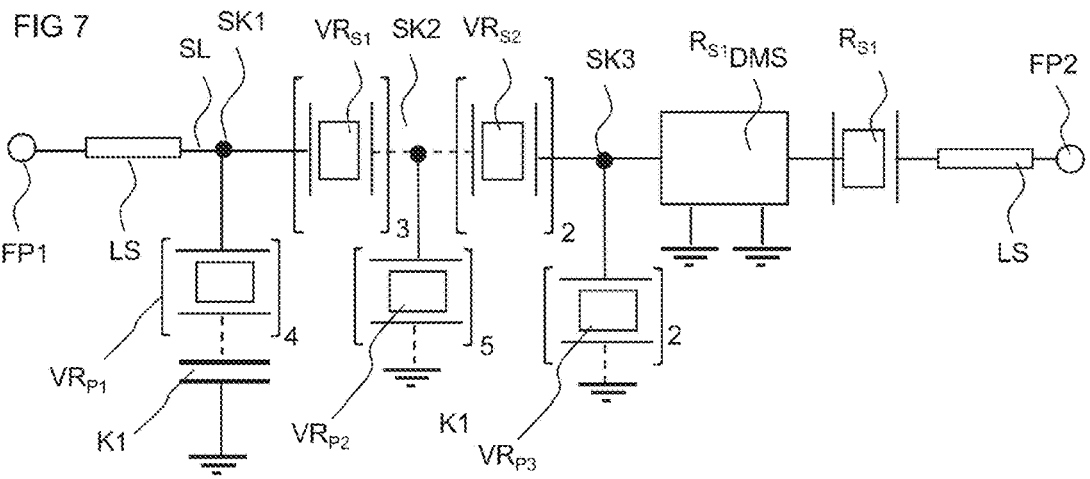
FIG. 7 shows a filter circuit comprising an inductance in the signal path as an additional circuit element adjacent to the filter input and/or to the filter output.

FIG. 7 shows a schematic illustration of a real filter circuit which is designed for a concrete circuit environment or for specific real system requirements and which is designed for a maximum reduction of intermodulation products. The serial signal line SL here has three circuit nodes SK1, SK2, SK3 for example, from which in each case a parallel branch PZ is branched off relative to ground.

Furthermore, a DMS filter DMS is connected in series in the signal line downstream of the third parallel branch.

A second serial interconnection VRS2 of serial resonators is arranged between the second and third circuit nodes SK2, SK3. A non-cascaded series resonator RS1 is provided between the DMS filter DMS and the second filter port FP2.

Such a filter circuit is designed for example for a nominal passband of 2620 to 2630 MHz. In order to compare this filter according to the invention, which is part of a filter circuit, with a filter which is designed according to the prior art but otherwise is as similar as possible, a reference filter was designed, comprising a first parallel branch having seven interconnected parallel resonators, a doubly cascaded interconnection of serial resonators, a second parallel branch having two parallel resonators, a serial resonator, a DMS filter, a further serial resonator and a doubly cascaded interconnection of two parallel resonators.

In the comparison of the filter according to the invention in accordance with FIG. 7 and the reference filter just described, it is found that the position and bandwidth of the passband are practically identical in both filters. For the filter according to the invention, minimal deteriorations regarding the insertion loss in the passband become apparent, and therewith a somewhat worsened damping in the near stop band.

The matrix parameters S11 and S22 indicating the standing wave ratio VSWR also exhibit slightly worsened values.

By contrast, a third-order intermodulation product interfering with the reference filter and occurring at a frequency of 2690 MHz is reduced by more than 10 dB with the filter according to the invention. Since otherwise the filter properties are practically unchanged or impaired only to an insignificant extent, whereas the suppression of the intermodulation products is greatly improved, the advantages achieved by the invention are clearly apparent. The success of the invention can also be seen from the fact that a comparable reduction of intermodulation products in the case of a filter according to the prior art without supplementarily connected capacitors according to the invention is achieved only with a degree of cascading of 13 for the first parallel resonator. Such a high degree of cascading, on account of the enormous area additionally required, is completely out of the question and is ruled out from the outset for realistic applications. With the invention the same result can be achieved on a significantly smaller area.

Figure 8:
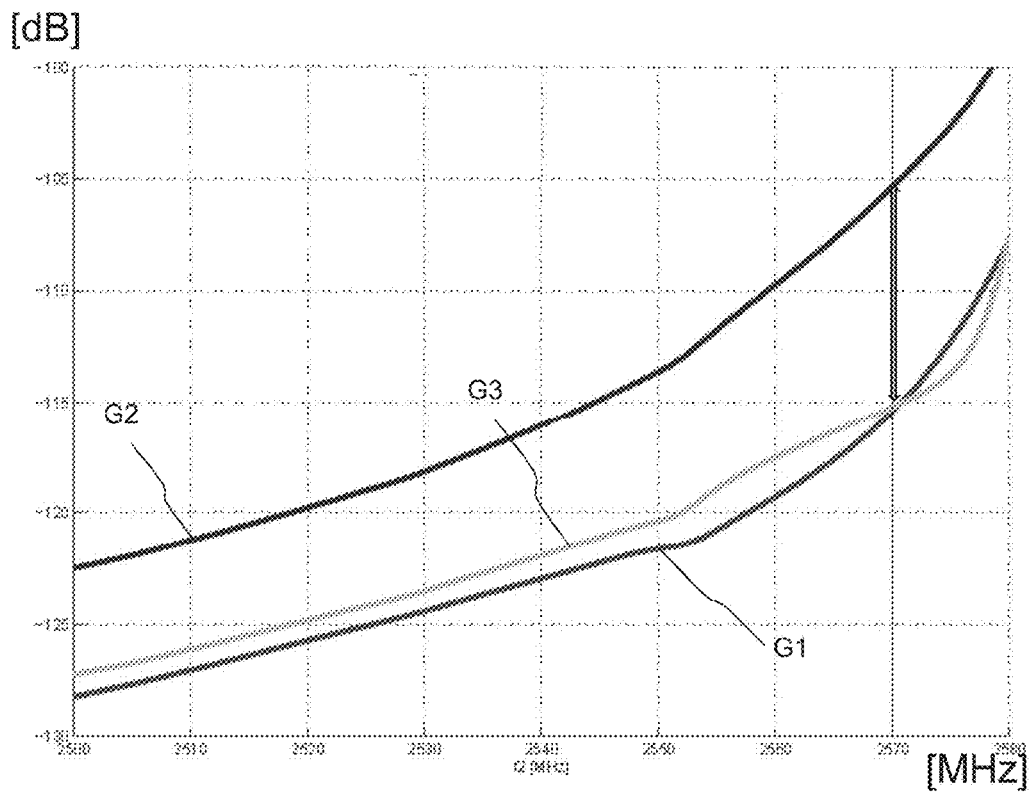
FIG. 8 shows the result of various simulations of how the occurrence of an intermodulation product is reduced with a filter circuit according to the invention.
Figure 9:
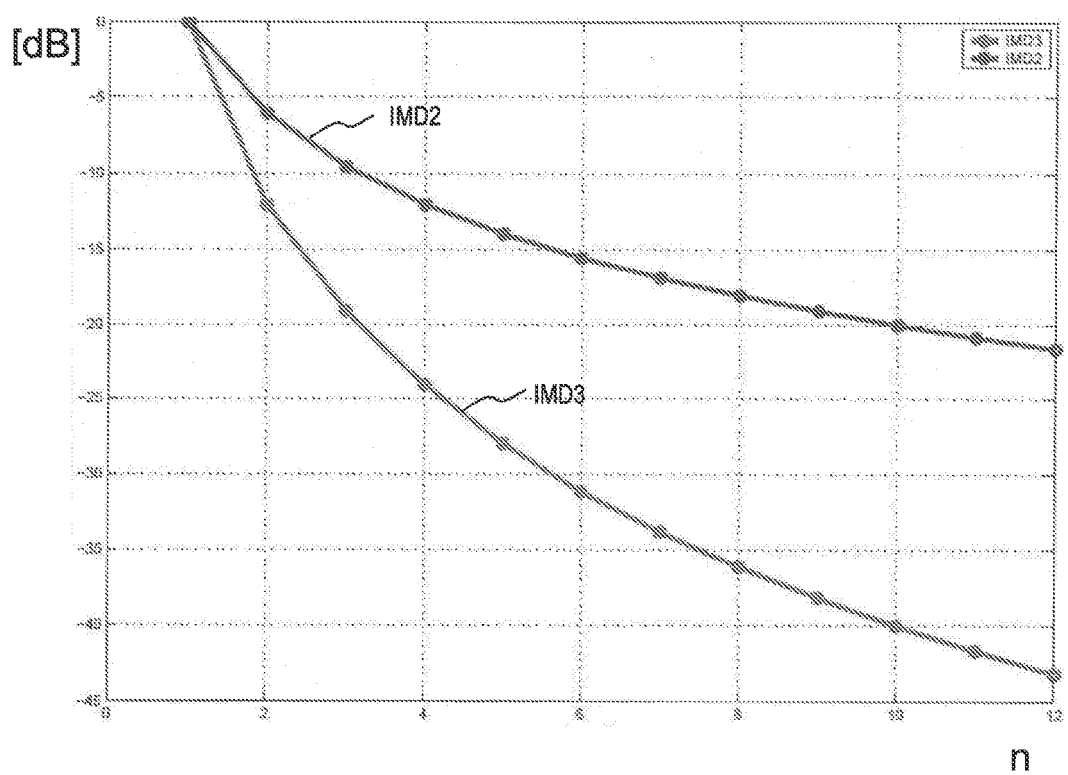
FIG. 9 shows the effect of the reduction of intermodulation products as a function of the degree of cascading of resonators used in the interconnection.

FIG. 8 shows how the occurrence or disappearance of interfering intermodulation products can be demonstrated in a simple manner with a filter as illustrated in FIG. 7. For this purpose, a first interference tone in a specific frequency range f1 and with a strength of 10 dBm is applied for example to the input of the filter from FIG. 7. A second interference frequency is varied over a frequency range f2 of 2500 to 2570 MHz and is likewise applied to the filter input. The power of said second interference signal is 5 dBm.

According to one exemplary system requirement, a third-order intermodulation product must be assessed at a constant frequency $f_{IMD}=2690$ MHz$=2*f2-f1$. FIG. 8 illustrates a first graph G1, which was measured on a filter in accordance with FIG. 7 by the method described above. A second graph G2 shows a comparable filter which was tested by the same method but which is embodied without the first capacitor in the first parallel branch. The damping of corresponding third-order intermodulation products is plotted against frequency in the figure.

FIG. 8 shows that the graph G1 for the filter according to the invention has, in comparison with the second graph G2, a suppression of the resulting intermodulation product that is improved by 10 dB, in particular at the critical frequency of 2570 MHz at which the intermodulation product is greatest. A third graph G3 shows the behavior of a filter arrangement which is likewise embodied without a first capacitor in the first parallel branch, but in which the number of cascaded parallel resonators was increased until the same suppression of intermodulation products at the frequency of 2570 MHz under consideration was achieved. It is evident that this is the case only with a degree of cascading of 13, that is to say a series interconnection of 13 parallel resonators.

In comparison with the filter according to the invention having four cascaded parallel resonators in the first parallel branch, this means a significant reduction of the required filter area. In this regard, let the reference filter described have a relative acoustic area requirement of 1.0. The filter according to the invention then has a relative acoustic area requirement of 1.6. By contrast, the filter having the degree of cascading of 13 (corresponds to graph G3 in FIG. 8) has a relative acoustic area requirement of 2.8. In comparison with the filter according to the invention as reference, this corresponds to a relative acoustic area requirement increased by the factor of 1.8. To put it in yet another way, for the same suppression of the $f_{IMD}$ under consideration, an area saving of acoustic area by the factor of 1.8 is achieved by the invention.

It should be expected that more than two strong interference signals can also occur in a filter circuit. The standardization proceeds in a direction that can be calculated e.g. with up to four strong transmission signals occurring simultaneously at four different frequencies in a smartphone (2×cellular, 2×WLAN). As a result, a multiplicity of further possible nonlinear mixed products can then arise whose frequency can lie in reception bands and can thus greatly reduce the reception sensitivity. This multiplicity of possible nonlinear mixed products can also be significantly suppressed by the invention, which thus provides a filter having improved reception sensitivity for all these cases.

As already mentioned in the introduction, a change in the degree of cascading must be compensated for with an adaptation of the static capacitance of the cascaded resonators. For a filter according to the invention as illustrated in FIG. 7, for example, which has four series-connected parallel resonators and a first capacitor K1 in the first parallel branch, it holds true that all the resonators of a serial interconnection (cascade) of series or parallel resonators advantageously have the same static capacitance $C_{S,R}$.

Generally it holds true that: if m resonators are cascade-connected, then the static total capacitance $C_{S,R,tot}$ of the cascade is $C_{S,R,tot}=C_{S,R}/m$. A capacitor K connected in series therewith should then have a capacitance $C_K$ $$C_K = a * C_{S,R,tot}$$

where a should be chosen to be greater than or equal to 1. The capacitance $C_{S,total}$ of cascade and capacitor is then $$C_{s,total} = C_K/(a+1)$$

For the embodiments in which a capacitor is connected in parallel with a cascade of m resonators having in each case a static capacitance $C_{S,R}$, the static total capacitance $C_{S,R,tot}$ of the cascade again results as $C_{S,R}/m$.

A capacitor K connected in parallel therewith should then have a capacitance $C_K = b * C_{S,R,tot} = b/m * C_{S,R}$, where b should also be chosen to be greater than or equal to 1.

The capacitance $C_{S,total}$ of cascade and capacitor in parallel therewith is then $$C_{S,total} = C_K * (1+b)/b$$

For the dimensioning of the capacitances in a filter according to the invention, it is possible to differentiate between two general cases A and B, for which different advantageous dimensionings are applicable.

In case A, let the filter begin with serial resonators connected in a cascade VRS and a second capacitor K2 connected in series or in parallel therewith. The subsequent first parallel branch PZ1 also comprises a cascade VRP1 of resonators that are connected in series or in parallel with a first capacitor K1. Further serial resonators connected in a cascade VRS2 are present in the series branch. At least one further parallel branch PZ comprises a further cascade VRP2 of resonators.

The total capacitances of all the parallel branches of the ladder-type filter or sub filter, whether with or without an interconnected capacitor, should advantageously be chosen to be approximately of the same magnitude. An exception is formed here only by the last parallel branch at the second filter port FP2, or the filter output. The last parallel branch can be a terminating parallel branch. In that case, as seen in the signal direction—an acoustic element also no longer follows in the series branch.

The total capacitance of the first cascade of serial resonators interconnected with a second capacitor, including the capacitor, is then advantageously dimensioned to be of approximately double the magnitude of the total capacitance of further cascades VRS2 in the series branch. An exception is formed here only by the last series resonator at the second filter port FP2, or the filter output. The last series resonator can be a terminating series resonator. In that case—as seen in the signal direction—an acoustic element also no longer follows in a parallel branch.

In case B, let the filter begin with a parallel branch comprising a cascade VRP1 of resonators connected in series or in parallel with a first capacitor K1. Serial resonators connected in a cascade VRS and a capacitor K2 connected in series or in parallel therewith then follow in the series branch. Even further serial resonators connected in a cascade VRS2 are present in the series branch. At least one further parallel branch PZ comprises a cascade VRP2 of resonators.

It holds true in this case that the total capacitances of all the cascades of the ladder-type filter or sub filter (with or without a second capacitor) in the series branch should be chosen to be approximately equal. An exception is formed here only by the last or terminating series resonator at the second filter port FP2, or the filter output. The total capacitance of the first cascade of parallel resonators VRP1 interconnected with a first capacitor (including the capacitor K1) is then advantageously dimensioned to be of approximately half the magnitude of the total capacitance of further cascades VRP2 in the parallel branch. An exception is formed here only by the last or terminating parallel branch at the second filter port FP2, or the filter output.

LIST OF TERMS AND REFERENCE SIGNS

F1 First filter
FP1 First filter port, e.g. filter input
FP2 Second filter port, e.g. filter output
G1 First graph
G2 Second graph
G3 Third graph
K1 First capacitor, in the parallel branch
K2 Second capacitor, in the serial signal path
LP Inductance in the parallel branch
LS Inductance in the signal path
PZ Parallel branch
RP Resonators in the parallel branch
RS Resonators in the serial signal path
SK Circuit node in the series branch, connected to
SL Serial signal path, connects
VRP Interconnections of resonators in the parallel branch
VRS Interconnections of resonators in the serial signal path

The invention claimed is:
1. A filter circuit comprising:
 a filter comprising:
  a serial signal path coupling a first filter port to a second filter port;
  nodes arranged in the serial signal path, each of the nodes being connected to a fixed potential via a respective parallel branch;

resonators arranged in the serial signal path and the parallel branches, the resonators comprising:
a first set of cascaded resonators arranged in a first parallel branch, and
a second set of cascaded resonators arranged in the serial signal path; and
at least one of a first capacitor or a second capacitor, the first capacitor arranged in series or in parallel with the first parallel branch, the second capacitor arranged in series or in parallel with the serial signal path, wherein:
each of the parallel branches have a total capacitance resulting from a capacitance of the resonators in the parallel branch and a third capacitor connected in parallel or in series with the resonators in the parallel branch, and
the total capacitances are the same except for one parallel branch.

2. The filter circuit according to claim 1, wherein the resonators are electroacoustic resonators.

3. The filter circuit according to claim 1, wherein the first set of cascaded resonators comprises 1 to 8 resonators coupled in series.

4. The filter circuit according to claim 1, wherein the second capacitor is arranged in the serial signal path between the second set of cascaded resonators and the first filter port, wherein the first capacitor is arranged in parallel with the first set of cascaded resonators.

5. The filter circuit according to claim 1, further comprising at least one of one or more reception branches or one or more transmission branches coupled to at least one of the first or second filter port, wherein the one or more transmission branches are configured for transmission in different transmission bands, and the one or more reception branches are configured for reception in different reception bands.

6. The filter circuit according to claim 1, wherein the filter is a reception filter or a transmission filter of a duplexer.

7. The filter circuit according to claim 1, wherein the filter further comprises a fourth capacitor arranged downstream from one of the resonators closest to the second filter port in the serial signal path, wherein the second capacitor is arranged upstream from the second set of cascaded resonators, and each of the third capacitors is arranged between the remaining sets of cascaded resonators.

8. The filter circuit according to claim 1, further comprising a double mode surface acoustic wave (DMS) filter arranged in the serial signal path.

9. The filter circuit according to claim 1, wherein:
the filter circuit is a chip component,
the resonators are surface acoustic wave (SAW) one-port resonators,
the resonators are arranged on a common chip,
at least one of the first capacitor or the second capacitor is realized on the chip as a plate capacitor having two capacitor electrodes, shaped in a planar fashion relative to a conductor track, and a dielectric layer arranged therebetween,
the dielectric layer together with a further functional layer of the chip component comprise the same material and have the same layer thickness,
a bottom electrode of the at least one of the first capacitor or the second capacitor is formed from a metallization of one of the one-port resonators, and
a top electrode of the at least one of the first capacitor or the second capacitor is formed from a pad thickening produced above a connection pad of the filter.

10. The filter circuit according to claim 9, wherein the dielectric layer is produced between the capacitor electrodes together with an insulation layer used for insulation between conductor track sections of the filter circuit that cross one another.

11. The filter circuit according to claim 9, wherein, the dielectric layer comprises a material having a positive temperature coefficient.

12. The filter circuit according to claim 1, wherein the first and second capacitors are at least one of embedded as external discrete capacitors or integrated into at least one of a low temperature co-fired ceramic (LTCC) or a laminate.

13. A filter circuit comprising:
a filter comprising:
a serial signal path coupling a first filter port to a second filter port;
nodes arranged in the serial signal path, each of the nodes being connected to a fixed potential via a respective parallel branch;
resonators arranged in the serial signal path and the parallel branches, the resonators comprising:
a first set of cascaded resonators arranged in a first parallel branch, and
a second set of cascaded resonators arranged in the serial signal path; and
at least one of a first capacitor or a second capacitor, the first capacitor arranged in series or in parallel with the first parallel branch, the second capacitor arranged in series or in parallel with the serial signal path, wherein:
the resonators arranged in the serial signal path comprise sets of cascaded resonators including the second set of cascaded resonators,
each of the sets of cascaded resonators in the serial signal path have a total capacitance resulting from the capacitance of the cascaded resonators and that of a third capacitor coupled in parallel or in series with the cascaded resonators,
the total capacitances are the same except for at least one of the resonators arranged in the serial signal path.

14. A filter circuit comprising:
a filter comprising:
a serial signal path coupling a first filter port to a second filter port;
nodes arranged in the serial signal path, each of the nodes being connected to a fixed potential via a respective parallel branch;
resonators arranged in the serial signal path and the parallel branches, the resonators comprising:
a first set of cascaded resonators arranged in a first parallel branch, and
a second set of cascaded resonators arranged in the serial signal path; and
at least one of a first capacitor or a second capacitor, the first capacitor arranged in series or in parallel with the first parallel branch, the second capacitor arranged in series or in parallel with the serial signal path, wherein the resonators are arranged as sets of cascaded resonators, and a degree of cascading of the sets of cascaded resonators decreases with increasing distance from the first filter port.

* * * * *